(12) United States Patent
Yugou et al.

(10) Patent No.: US 8,970,143 B2
(45) Date of Patent: Mar. 3, 2015

(54) POWER SOURCE APPARATUS

(75) Inventors: Masaki Yugou, kakogawa (JP); Shinya Nakano, kasai (JP)

(73) Assignee: Sanyo Electric Co., Ltd., Osaka (JP)

( * ) Notice: Subject to any disclaimer, the term of this patent is extended or adjusted under 35 U.S.C. 154(b) by 176 days.

(21) Appl. No.: 13/824,024

(22) PCT Filed: Sep. 27, 2011

(86) PCT No.: PCT/JP2011/072125
§ 371 (c)(1),
(2), (4) Date: Mar. 15, 2013

(87) PCT Pub. No.: WO2012/043591
PCT Pub. Date: Apr. 5, 2012

(65) Prior Publication Data
US 2013/0187575 A1    Jul. 25, 2013

(30) Foreign Application Priority Data

Sep. 30, 2010   (JP) ................................. 2010-223159

(51) Int. Cl.
*G01R 15/14*   (2006.01)
*H02P 23/14*   (2006.01)
(Continued)

(52) U.S. Cl.
CPC ............ *H02P 23/14* (2013.01); *G01R 31/3696* (2013.01); *H01M 10/425* (2013.01);
(Continued)

(58) Field of Classification Search
USPC ......... 318/139; 338/49, 17, 87, 118, 137, 330
See application file for complete search history.

(56) References Cited

U.S. PATENT DOCUMENTS

| | | | |
|---|---|---|---|
| 4,001,761 A | 1/1977 | Liebler et al. | |
| 4,028,793 A | 6/1977 | Liebler et al. | |
| 5,602,451 A * | 2/1997 | Kohge et al. | 318/293 |
| 6,184,660 B1 * | 2/2001 | Hatular | 320/141 |
| 8,282,275 B2 * | 10/2012 | Akaboshi et al. | 374/152 |

FOREIGN PATENT DOCUMENTS

| | | |
|---|---|---|
| JP | 52-4046 | 1/1977 |
| JP | 3-190103 | 8/1991 |

(Continued)

OTHER PUBLICATIONS

International Search Report issued Dec. 13, 2011 in International (PCT) Application No. PCT/JP2011/072125.

*Primary Examiner* — Rita Leykin
(74) *Attorney, Agent, or Firm* — Wenderoth, Lind & Ponack, LLP

(57) ABSTRACT

The power source apparatus is provided with a shunt resistor connected in series with batteries, and a current computation circuit that detects the voltage induced by current flow through the shunt resistor to compute battery current. The shunt resistor is provided with a pair of current flow terminals at two separated points on a metal plate connected in series with the batteries via connecting leads, and a pair of voltage detection terminals on a side of the metal plate between the pair of current flow terminals. Further, the shunt resistor has interval adjustment structures to adjust the distance (L) between attachment points where the connecting leads attach to the pair of current flow terminals. The distance (L) between lead attachment points is adjusted with the interval adjustment structures to finely adjust the voltage induced at the voltage detection terminals due to current flow between the two attachment points.

6 Claims, 6 Drawing Sheets

(51) Int. Cl.
  *G01R 31/36* (2006.01)
  *H01M 10/42* (2006.01)
  *H01M 10/48* (2006.01)
  *G01R 1/20* (2006.01)

(52) U.S. Cl.
  CPC ............... H01M10/48 (2013.01); *G01R 1/203* (2013.01); *H01M 10/4285* (2013.01); *H01M 2200/103* (2013.01); *H01M 2200/108* (2013.01)
  USPC .............. 318/139; 338/49; 338/17; 338/87; 338/118; 338/137

(56) References Cited

FOREIGN PATENT DOCUMENTS

| | | | | |
|---|---|---|---|---|
| JP | 2004-117045 | 4/2004 | | |
| JP | 2008-48506 | 2/2008 | | |
| JP | 2009-204531 | 9/2009 | | |
| JP | 2009-244065 | 10/2009 | | |
| JP | 200920453 | * 10/2009 | ............. | G01R 15/14 |
| JP | 2009-266977 | 11/2009 | | |

* cited by examiner

POWER SOURCE APPARATUS

BACKGROUND OF THE INVENTION

1. Field of the Invention

The present invention relates to a power source apparatus having a shunt resistor connected in series with the batteries to determine battery current by detecting the voltage induced across the resistor, and in particular to a power source apparatus optimally suited as a power source that is charged and discharged with high current such as a power source that supplies power to a motor to drive a vehicle.

2. Description of the Related Art

A power source apparatus is equipped with current sensing to detect battery charging and discharging current. A power source apparatus with a current sensor can integrate current to compute remaining capacity, can control battery charging and discharging using the computed remaining capacity, and can prevent battery over-charging and over-discharging. Batteries have the characteristic that they degrade significantly due to over-charging and over-discharging. Accordingly, accurate detection of the remaining capacity to prevent over-charging and over-discharging can effectively prevent battery degradation and lengthen battery lifetime. However, accurate detection of the battery current is critical for actual implementation. This is because battery current detection error results in battery remaining capacity error. In particular, since remaining capacity is computed from the integral of the current, current detection error can accumulate over time and remaining capacity error can gradually increases over time.

Since current is computed by the current sensor from an output voltage proportional to the electrical resistance of the shunt resistor, it is important to establish an accurate value for the electrical resistance of the shunt resistor to accurately detect current. In addition, wasted power proportional to the square of the current is consumed by the shunt resistor, and Joule heating occurs as a result of that power consumption. To limit wasted power consumption, the electrical resistance of the shunt resistor, which detects high currents, must be made small. Further, to efficiently dissipate heat, it is also important to make the resistor surface area large.

A shunt resistor made of metal plate has low electrical resistance and superior heat dissipating characteristics, and is ideally suited for high current detection. Therefore, the metal plate shunt resistor has been adopted for current sensors in high current power source apparatus such as vehicle power source apparatus.

A shunt resistor formed from metal plate and used in a vehicle power source apparatus is cited in Japanese Laid-Open Patent Publication 2004-117,045 and Japanese Laid-Open Patent Publication 2008-48,506.

The electrical resistance of a metal plate shunt resistor as cited in the references is determined by metal plate material, thickness, width, and length. The shunt resistor has current flow (forcing) terminals established at both ends of a metal plate of given length and width, and connecting leads are attached to those terminals for series connection with the batteries. Voltage detection (sensing) terminals are established at two points between the current flow terminals to detect induced voltage proportional to the current flow. The voltage detection terminals are connected to a current sensor difference amplifier, and the induced voltage is amplified by the difference amplifier to detect the battery current. The current sensor computes current from the induced voltage, which is assumed to be the product of the current and the electrical resistance of the shunt resistor. The electrical resistance used for current detection is not the resistance of the entire shunt resistor. More specifically, the electrical resistance is not resistance between the current flow terminals. Rather, for a metal plate shunt resistor provided with voltage detection terminals positioned inside the current flow terminals, an induced voltage is output that is the product of the current and electrical resistance between the pair of voltage detection terminals. The current is computed from that induced voltage. Since current is determined from the voltage induced between the voltage detection terminals, the shunt resistor is required to have an accurate and constant electrical resistance value between the pair of voltage detection terminals. The electrical resistance between the voltage detection terminals can be set according to the thickness, width, and length of the metal plate material between the voltage detection terminals. However, even when the metal plate material is fabricated to have constant dimensions between the voltage detection terminals, processing variation results in electrical resistance error. Electrical resistance error due to processing variation causes error in the induced voltage, which in turn results in error in the detected current. The electrical resistance of a shunt resistor made from metal plate can be adjusted by techniques such as shaving down the thickness or width of the metal plate between the voltage detection terminals. However, these techniques post-process shunt resistors manufactured in quantity to adjust their shapes, and consequently have the drawback that electrical resistance cannot be adjusted in a simple manner.

The present invention was developed to resolve the drawbacks described above. Thus, it is a primary object of the present invention to provide a power source apparatus that can finely adjust the actual electrical resistance between voltage detection terminals in an extremely simple and accurate manner without changing metal plate dimensions to allow accurate current detection with a shunt resistor.

SUMMARY OF THE INVENTION

The power source apparatus of the present invention is provided with a shunt resistor 10, 30, 40, 50 connected in series with batteries 1 that can be charged, and a current computation circuit 20, 60, 70 that detects the voltage induced by current flow through the shunt resistor 10, 30, 40, 50 and computes the battery 1 current. The shunt resistor 10, 30, 40, 50 is provided with a pair of current flow terminals 11, 31, 41, 51 at two points on a metal plate that are separated and connected in series with the batteries 1 via connecting leads 13, and a pair of voltage detection terminals 12, 32, 42, 52 on a side of the metal plate in between the pair of current flow terminals 11, 31, 41, 51 where a voltage is induced proportional to the current flow. Further, the shunt resistor 10, 30, 40, 50 has interval adjustment structures 17 to adjust the distance (L) of the interval between attachment points 16 where the connecting leads 13 attach to the pair of current flow terminals 11, 31, 41, 51. The distance (L) between the attachment points 16, where the pair of connecting leads 13 attach, is adjusted with the interval adjustment structures 17 to finely adjust the voltage induced at the voltage detection terminals 12, 32, 42, 52 due to current flow between the two attachment points 16.

The power source apparatus described above has the characteristic that the actual electrical resistance between voltage detection terminals can be finely adjusted in an extremely simple and accurate manner without changing metal plate dimensions to allow accurate current detection with a shunt resistor. This is because the shunt resistor in the power source apparatus described above is provided with interval adjustment structures in the current flow terminals connected in series with the batteries to adjust the distance (L) of the interval between connecting lead attachment points. The interval adjustment structures adjust the distance (L) between the attachment points of the pair of connecting leads to finely adjust the voltage induced across the voltage detection terminals. Specifically, the distance (L) between current flow terminal connecting lead attachment points is adjusted without changing the metal plate thickness, width or length between the voltage detection terminals. This controls the current distribution within the metal plate shunt resistor and adjusts the voltage induced across the voltage detection terminals.

Turning to FIGS. 1 and 2, change in equipotential lines in a metal plate shunt resistor is shown corresponding to change in the current distribution caused by changing the connecting lead attachment points 16 without varying the location or dimensions between the voltage detection terminals. The distance (L) between attachment points 16 is longer for the shunt resistor 10 in FIG. 1 than for the shunt resistor 10 in FIG. 2. FIGS. 1 and 2 show equipotential lines produced by the same current flow between the pair of current flow terminals 11. However, even though the same current flows between current flow terminals 11 and dimensions between the voltage detection terminals 12 remain unchanged, equipotential line positions change and a difference in the voltage induced across the voltage detection terminals 12 develops. Specifically, the distance (L) between connecting lead attachment points 16 for the shunt resistor 10 of FIG. 2 is narrower than that of FIG. 1, the equipotential line density between the voltage detection terminals 12 is greater for FIG. 2, and the induced voltage is higher for FIG. 2. Here, the fact that a higher voltage V is induced when the actual current I is presumed to have the same value means that the actual resistance R between the voltage detection terminals has increased ($V=IR$). Therefore, the actual resistance R between the voltage detection terminals can be adjusted to a higher value by making the distance (L) between the attachment points 16 narrower. Further, since a given constant resistance Re is used to compute current, making the induced voltage V higher means the computed current Ie proportional to that voltage V is calculated to have a value higher than the actual current I. This can be understood as the result of a change in the actual resistance R of the shunt resistor.

The batteries 1 in the power source of the present invention can be batteries that supply power to a motor 3 that drives a vehicle.

In the power source apparatus of the present invention, the ratio (W/D) of the lateral width (W) of the metal plate shunt resistor 10, 30, 40, 50 at the voltage detection terminals 12, 32, 42, 52 to the distance (D) between the current flow terminals 11, 31, 41, 51 can be made greater than 1/20. Since the width (W) of the metal plate is made large between the voltage detection terminals of this shunt resistor, the current distribution between the voltage detection terminals can be changed significantly by changing the distance (D) between the current flow terminals. Accordingly, this power source apparatus has the characteristic that the voltage induced across the voltage detection terminals can be efficiently adjusted by changing the distance of the interval between the current flow terminals.

In the power source apparatus of the present invention, the connecting leads 13 can attach to the current flow terminals 11, 31, 41, 51 via bolts 15 (or set-screws). The bolts 15 insert into elongated holes 18 to attach the connecting leads 13 to the current flow terminals 11. The elongated holes 18 are elongated in a direction that can adjust the length of the interval between the pair of current flow terminals 11 and serve as the interval adjustment structures 17. This power source apparatus has the characteristic that since the voltage induced across the voltage detection terminals can be adjusted by changing the connecting lead bolt attachment positions, the actual resistance of the shunt resistor can be finely adjusted in a simple manner.

In the power source apparatus of the present invention, the shunt resistor 10, 30, 40, 50 can have voltage detection terminals 12, 32, 42, 52 established in a manner projecting outward from the region between the pair of current flow terminals 11, 31, 41, 51. This power source apparatus has the characteristic that circuitry to detect the voltage induced across the shunt resistor voltage detection terminals can be easily connected in a manner allowing accurate voltage detection.

In addition to current computation circuit 20, 60, 70 detection of battery 1 charging and discharging current from voltage induced in the shunt resistor 10, 30, 40, 50, the power source apparatus of the present invention can have a control circuit 5 that determines battery 1 remaining capacity from the detected current and controls battery 1 charging and discharging. This power source apparatus has the characteristic that it can accurately detect remaining battery capacity and can lengthen battery lifetime by charging and discharging the batteries while preventing over-charging and over-discharging.

DETAILED DESCRIPTION OF THE INVENTION

The following describes embodiments of the present invention based on the figures. However, the following embodiments are merely specific examples of a power source apparatus representative of the technology associated with the present invention, and the power source apparatus of the present invention is not limited to the embodiments described below. Further, components cited in the claims are in no way limited to the components indicated in the embodiments.

Figure 1:
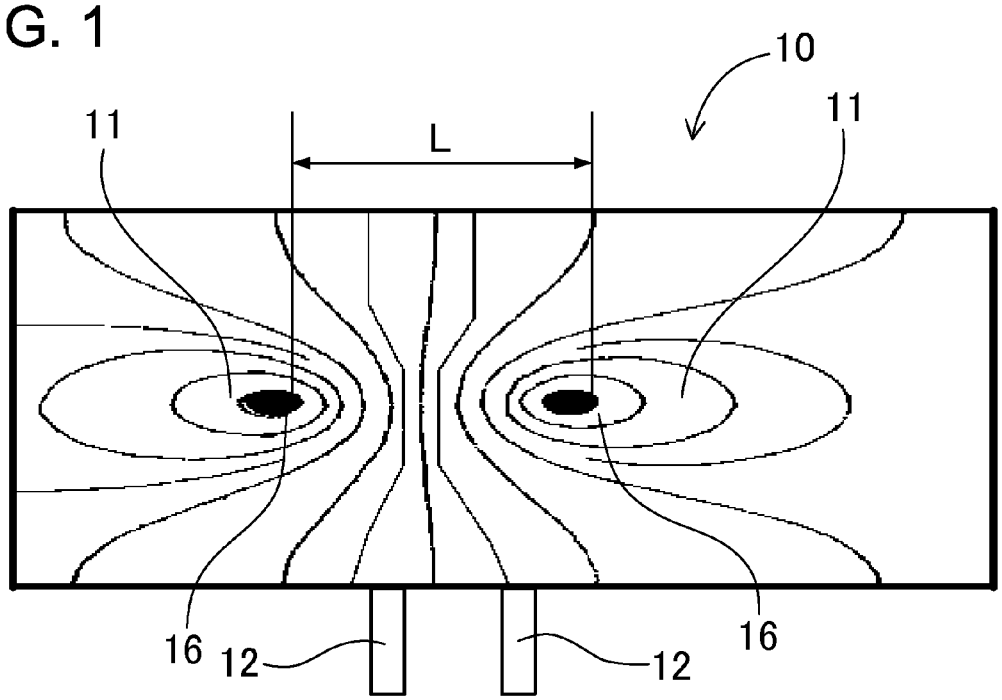
FIG. 1 is a diagram showing equipotential lines due to current distributed in a shunt resistor for an embodiment of the power source apparatus of the present invention.
Figure 2:
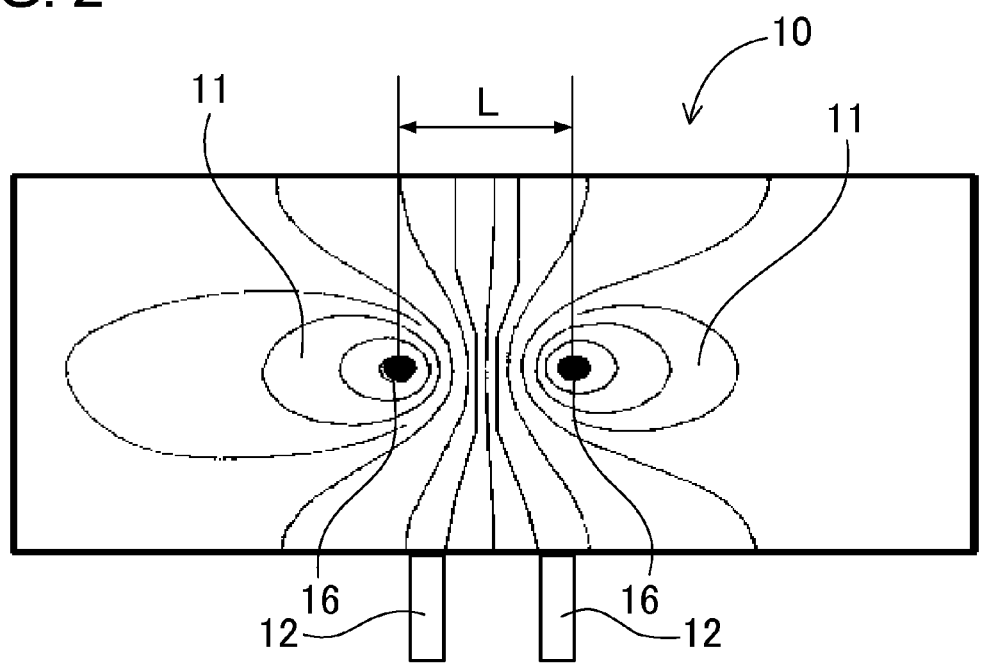
FIG. 2 is a diagram showing equipotential lines in the shunt resistor of FIG. 1 when the lead attachment points are changed.
Figure 3:
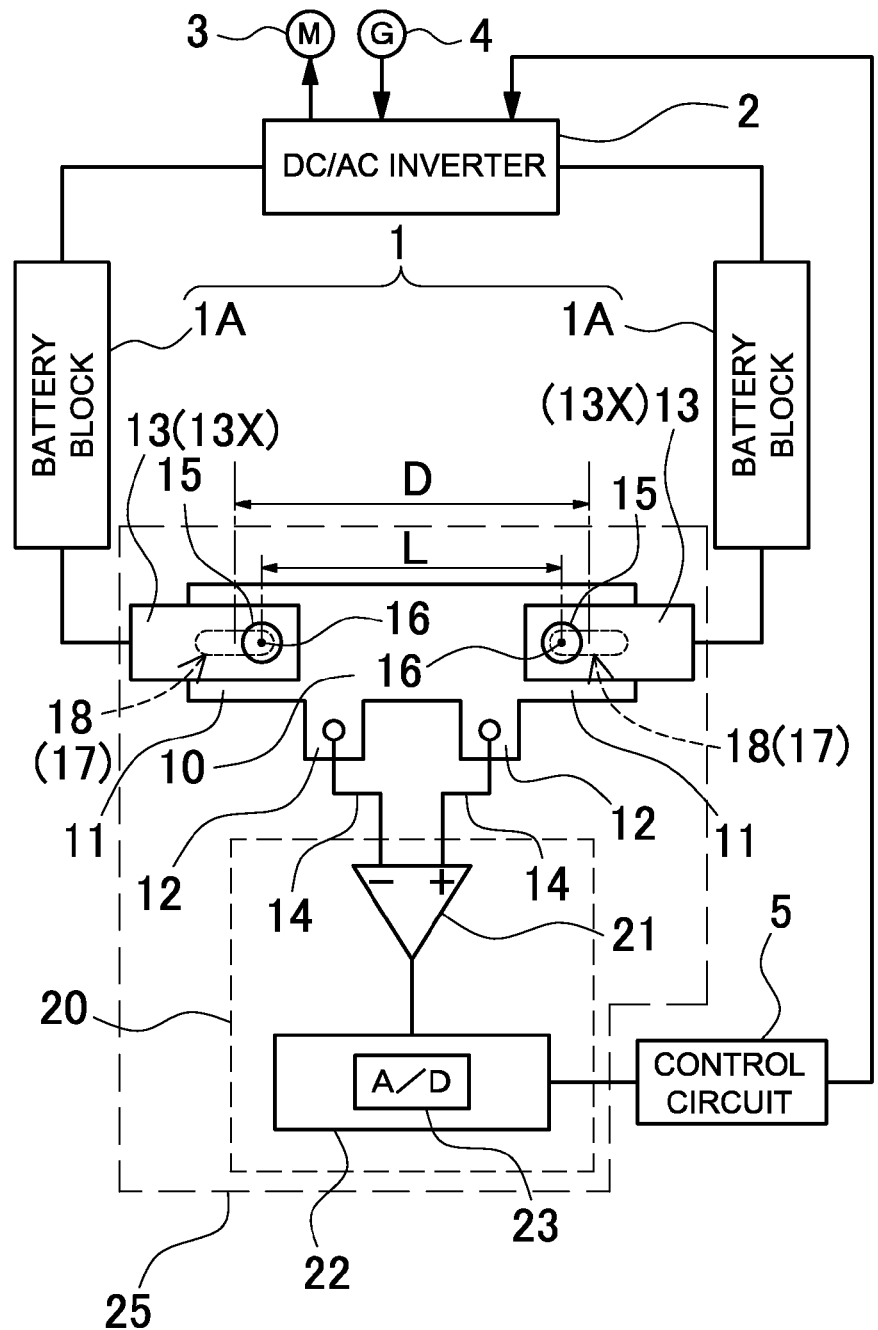
FIG. 3 is an abbreviated schematic of a power source apparatus configuration for an embodiment of the present invention.

Turning to FIG. 3, a vehicle power source apparatus carried on-board a hybrid vehicle (hybrid car, hybrid electric vehicle, HEV) or plug-in hybrid vehicle (PHV, plug-in hybrid electric vehicle, PHEV) is shown. However, the power source apparatus of the present invention can be used in any application charged and discharged with high current and is not limited only to automotive applications such as in a hybrid vehicle. The power source apparatus of the figure is provided with batteries 1 that supply power through a direct current-to-alternating current (DC/AC) inverter 2 to the motor 3 that drives the vehicle, a shunt resistor 10 connected in series with the batteries 1, and a current computation circuit 20 that detects voltage induced across the shunt resistor 10 to determine the battery 1 current. The power source apparatus detects current with a current detection circuit 25 that is made up of the shunt resistor 10 and the current computation circuit 20.

The batteries 1 are chargeable batteries such as lithium ion batteries or nickel hydride batteries connected in series to increase the output voltage, which for example, reaches a voltage of 100V to 300V. Charging and discharging current is controlled to attain a given remaining battery capacity to avoid battery 1 performance degradation due to over-charging or over-discharging, and to lengthen battery 1 lifetime. The remaining capacity of the batteries 1 is computed from the integral of the charging current and discharging current flowing through the batteries 1. Specifically, the varying remaining battery capacity is computed by adding integrated charging current and subtracting integrated discharging current.

The DC/AC inverter 2 is controlled by the control circuit 5 to convert DC supplied from the batteries 1 to three-phase AC delivered to the motor 3, and to convert AC produced by a generator 4 to DC to charge the batteries 1. The control circuit 5 controls the DC/AC inverter 2 to control power supplied from the batteries 1 to the motor, to control charging power from the generator 4 to the batteries 1, and to maintain a given remaining battery capacity.

Figure 4:
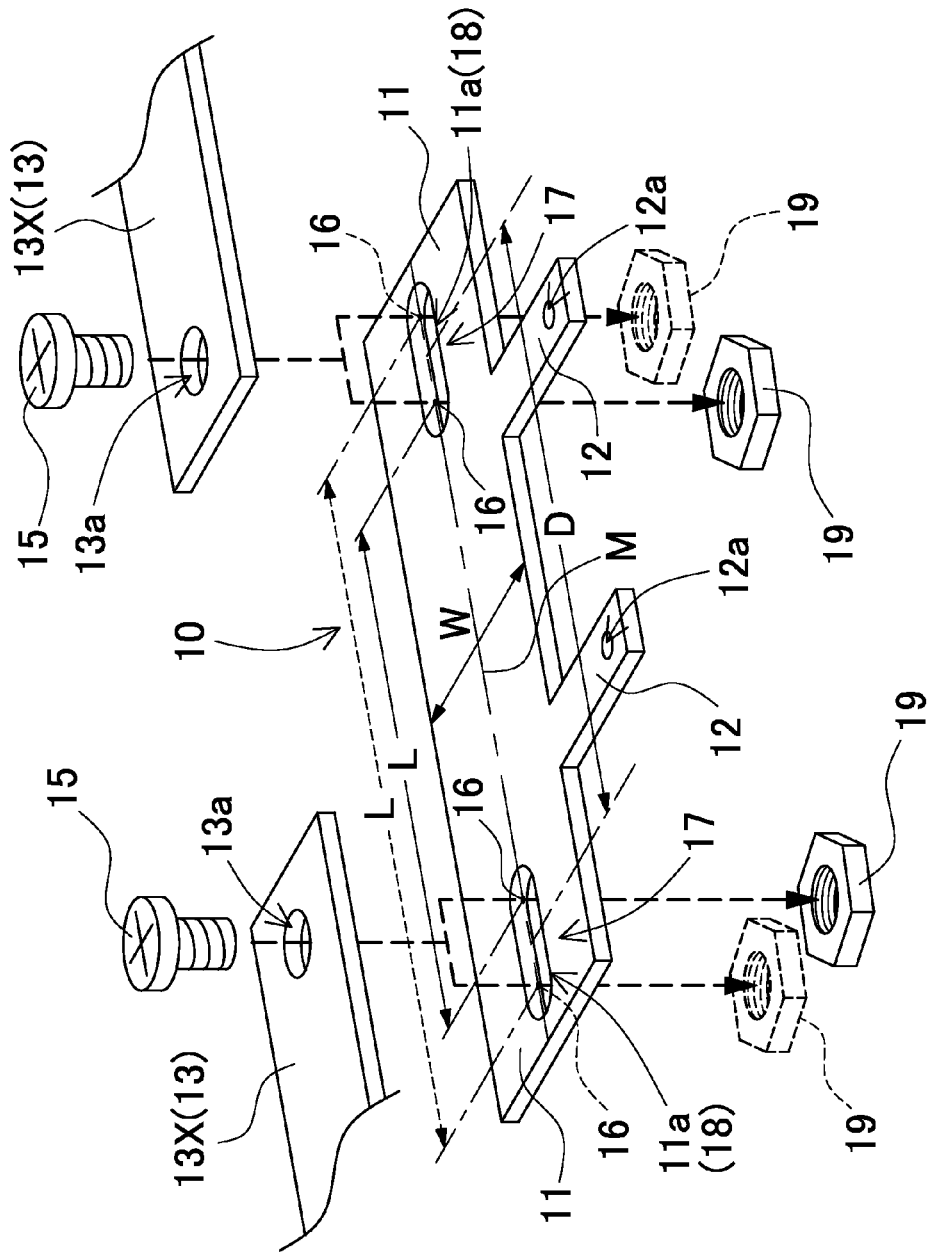
FIG. 4 is an exploded perspective view showing connections for the shunt resistor of the power source apparatus shown in FIG. 3.

The shunt resistor 10 is connected in series with the batteries 1 to detect the flow of battery 1 charging and discharging current. As shown in FIG. 4, the shunt resistor 10 is a metal plate having a given electrical resistance that generates a voltage proportional to the battery 1 current. Specifically, the voltage drop (E) produced by the shunt resistor 10 is determined from the electrical resistance (R) of the shunt resistor 10 and the current flow (I) according to the following equation (Ohm's law).

$$E = I \times R$$

Shunt resistor 10 voltage drop is detected and the battery 1 current is computed from this equation. The electrical resistance (R) of the shunt resistor 10 is set to a value as small as possible. This is because power consumed by the shunt resistor increases in proportion to the product of the electrical resistance (R) and the square of the current (I). Further, the electrical resistance (R) is set to a small value because a large amount of heat is generated by a shunt resistor that consumes a significant amount of power. A shunt resistor 10 with a small electrical resistance (R) generates little power loss, but the voltage generated for a given current flow is also small.

To amplify the small shunt resistor 10 voltage, the current computation circuit 20 shown in FIG. 3 is provided with an amplifier 21 on its input-side to amplify the shunt resistor 10 voltage. Signals amplified by the amplifier 21 are input to a computation section 22. In the computation section 22, analog signals input from the amplifier 21 are converted to digital signals by an analog-to-digital (ND) converter 23, and the battery 1 current is computed from the electrical resistance of the shunt resistor 10 and the gain of the amplifier 21. For example, when the voltage output from the ND converter 23 is E, the gain of the amplifier 21 is A, and the electrical resistance of the shunt resistor 10 is R, the computation section 22 calculates current from the following equation.

$$I = E / (A \times R)$$

In addition, the computation section 22 distinguishes between charging current and discharging current by the sign (+ or −) of the voltage output from the A/D converter 23.

The shunt resistor 10 that detects battery 1 current is provided with a pair of current flow terminals 11 connected in series with the batteries 1, and a pair of voltage detection terminals 12 that detect the voltage induced by current flow through the shunt resistor 10.

The two current flow terminals 11 are connected to connecting leads 13 to connect in series with the batteries 1 through the connecting leads 13. The connecting leads 13 are low-resistance metal lead-plates 13× or lead-wires with their ends attached to terminal connectors. The shunt resistor 10 in FIG. 3 is connected between two battery blocks 1A to connect the two battery blocks 1A in series. Although this shunt resistor 10 connects between two battery blocks 1A to connect in series with the batteries 1, the shunt resistor can also be connected in series with the batteries by connection at the input-side or the output-side of the batteries.

The two voltage detection terminals 12 are connected to the current computation circuit 20. The current flow terminals 11 and the voltage detection terminals 12 are both provided with through-holes 11a, 12a for bolt 15 (or set-screw) insertion to attach connecting leads 13, 14, which are lead-plates or lead-wires. Lead-plate or lead-wire connecting leads 13, 14 are mechanically attached and electrically connected to the current flow terminals 11 and voltage detection terminals 12 by bolts 15 inserted in the through-holes 11a, 12a.

As shown in FIG. 4, the shunt resistor 10 of the power source apparatus shown in FIG. 3 is made up of a metal plate of given resistance with a pair of current flow terminals 11 established in the end regions. Further, a pair of voltage detection terminals 12 are established projecting from a side region of the metal plate in between the two current flow terminals 11.

The shunt resistor 10 has interval adjustment structures 17 to adjust the interval between the connecting lead 13 attachment points at the current flow terminals 11, or more specifically, to adjust the distance (L) between the pair of lead attachment points 16. The distance (L) between attachment points 16 where the pair of connecting leads 13 connects with the current flow terminals 11 is adjusted by the interval adjustment structures 17 to finely adjust the voltage induced across the pair of voltage detection terminals 12 due to current flow between the pair of lead attachment points 16. By changing the distance (L) between the metal plate shunt resistor 10 lead attachment points 16, the distribution of current flowing in the metal plate can be adjusted. If the current distribution changes, the voltage induced in the voltage detection terminals 11 established on a side of the metal plate also changes. This is because the voltage detection terminals 12 output voltage induced at the side region of the metal plate.

The shunt resistor 10 in FIGS. 3 and 4 has connecting leads 13 attached to the current flow terminals 11 via bolts 15. The bolts 15 insert through both the connecting leads 13 and the shunt resistor 10 and nuts 19 are threaded onto the ends of the bolts 15 to attach the connecting leads 13 to the shunt resistor 10 current flow terminals 11. The shunt resistor 10 has elongated holes 18 that extend in a direction that can adjust the distance (L) between the connecting lead 13 attachment points 16, and those elongated holes 18 serve as the interval adjustment structures 17. Bolts 15 insert through connecting lead 13 through-holes 13a and shunt resistor 10 elongated holes 18 to attach the connecting leads 13 to the current flow terminals 11. The positions (in the lengthwise direction) where the bolts 15 pass through the elongated holes 18 are adjusted to adjust the distance (L) between attachment points 16. These interval adjustment structures 17 can adjust the distance (L) between lead attachment points 16 with a simple construction. However, the interval adjustment structures of the present invention are not limited to elongated holes established in the shunt resistor. This is because (for example) elongated holes could be established in the connecting leads, and the attachment positions of bolts passed through those elongated holes could be adjusted to adjust the positions of the connecting leads to the current flow terminals.

In a shunt resistor 10 that finely adjusts the voltage induced across the voltage detection terminals 12 by changing the distance (L) between connecting lead 13 attachment points 16, the voltage induced across the voltage detection terminals 12 can be adjusted more effectively by widening the lateral width (W). This is because increasing the lateral width (W) of the metal plate shunt resistor 10 with respect to the attachment point 17 distance (L) increases the change in lateral region current distribution. Accordingly, the ratio (W/D) of the lateral width (W) of the metal plate shunt resistor 10 to the distance (D) between the pair of current flow terminals 11 is made, for example, greater than 1/20, preferably greater than 1/15, and more preferably greater than 1/10. Note that in the present patent application, the distance (D) between the pair of current flow terminals 11 is defined as the distance (D) between the centers of the two through-holes 11a, which are the two elongated holes 18.

Figure 5:
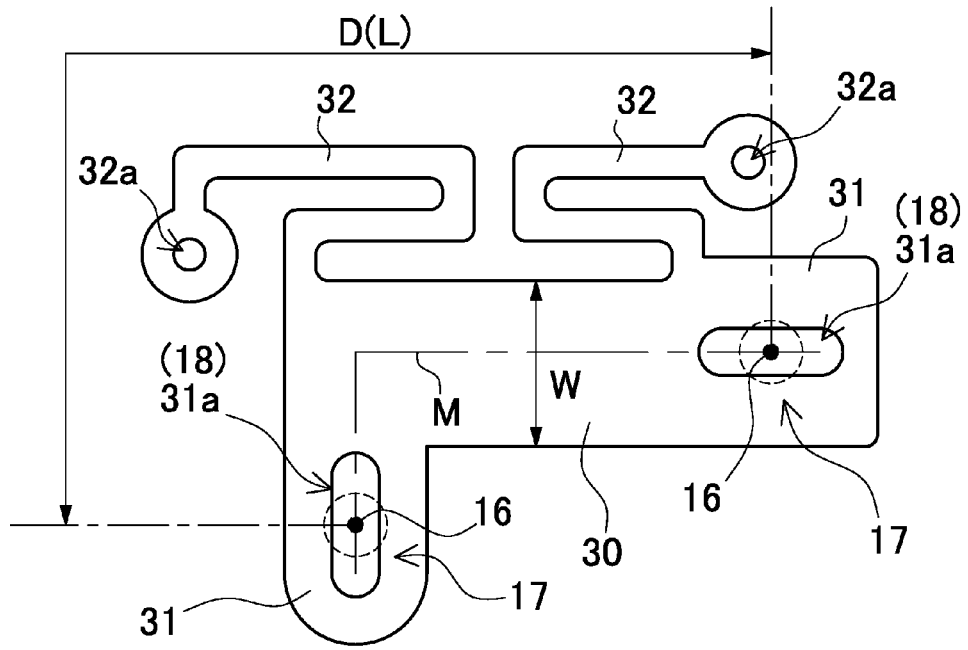
FIG. 5 is a plan view showing another example of a shunt resistor.
Figure 6:
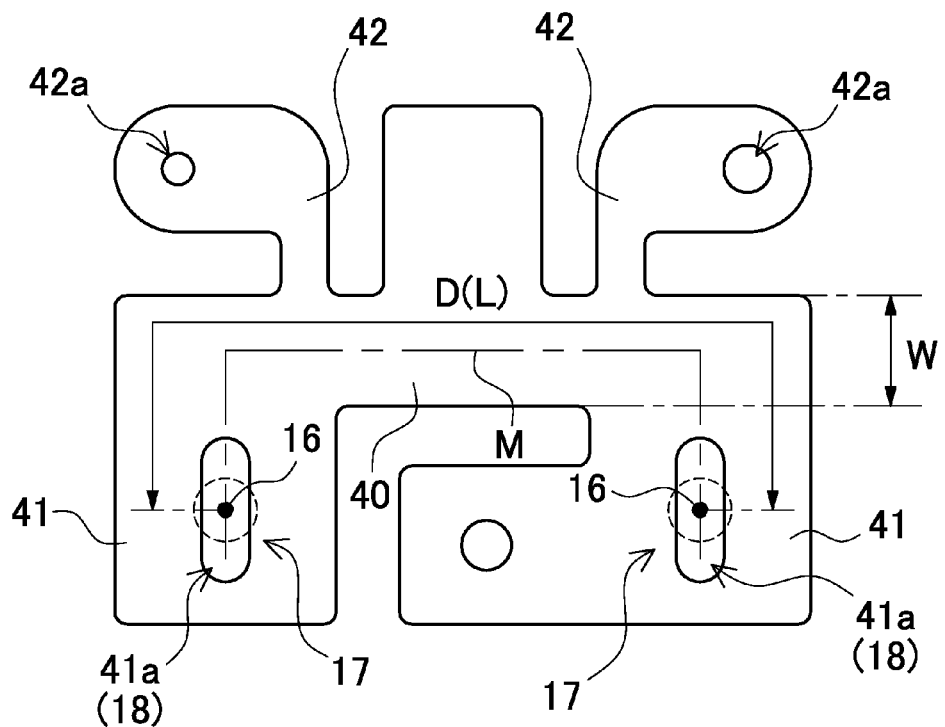
FIG. 6 is a plan view showing another example of a shunt resistor.

Turning to FIGS. 5 and 6, in a metal plate shunt resistor 30, 40 with bends between the two current flow terminals 31, 41, the length of the centerline M shown by the broken line in the figures is taken to be the distance (D) between the centers of the current flow terminal 31, 41 through-holes 31a, 41a. Further, for a shunt resistor 30, 40 with bends between the current flow terminals 31, 41 as shown in FIGS. 5 and 6, the distance (L) between lead attachment points 16 is also defined as length along the centerline M. A shunt resistor 30, 40 as shown in the figures has current flow terminal 31, 41 through-holes 31a, 41a formed as elongated holes 18. The elongated holes 18 are elongated a direction that can adjust the attachment point 16 distance (L), which is in a direction along the centerline (broken line in the figures), and those elongated holes 18 serve as the interval adjustment structures 17. Note in FIGS. 5 and 6, the labels 32, 42 indicate the voltage detection terminals and 32a, 42a indicate the through-holes in those voltage detection terminals.

The shunt resistor 10 shown in FIGS. 3 and 4 has voltage detection terminals 12 established on one side of a metal plate of given length and width. The shunt resistor 50 shown in FIGS. 7 and 8 has voltage detection terminals 52 established on both sides of a metal plate. This shunt resistor 50 has a pair of voltage detection terminals 52A established on the edge of one side of the metal plate, and another pair of voltage detection terminals 52B established on the edge of the other side of the metal plate. The shunt resistor 50 has two pairs of voltage detection terminals 52A, 52B established in opposing positions on opposite sides of the metal plate of given width, and the electrical resistance between each pair of voltage detection terminals 52A, 52B is established to be the same on both sides. A shunt resistor 50 with voltage detection terminals 52 on both sides has those voltage detection terminals 52A, 52B formed symmetrically on both sides of the centerline M. By providing a current computation circuit 60, 70 for the voltage detection terminals 52 on both sides of the shunt resistor 50, battery 1 current can be detected from one side even if the other side malfunctions. Each of these power source apparatus detect current with a current detection circuit 65, 75 made up of the shunt resistor 50 and the current computation circuit 60, 70.

In a shunt resistor 50 with symmetric voltage detection terminals 52 on both sides, adjusting the distance (L) between lead attachment points 16 at the current flow terminals 51 can simultaneously finely adjust the voltage induced across the voltage detection terminals 52 on both sides. Consequently, both sets of voltage detection terminals 52 can be adjusted together without having to adjust the voltage induced across each individual voltage detection terminal 52 pair. This allows accurate battery 1 current detection with either pair of voltage detection terminals 52. Therefore, this configuration has the characteristic that even if it becomes impossible to detect voltage with one pair of voltage detection terminals 52, battery 1 current can still be accurately detected from the voltage induced across the other pair of voltage detection terminals 52.

Figure 7:
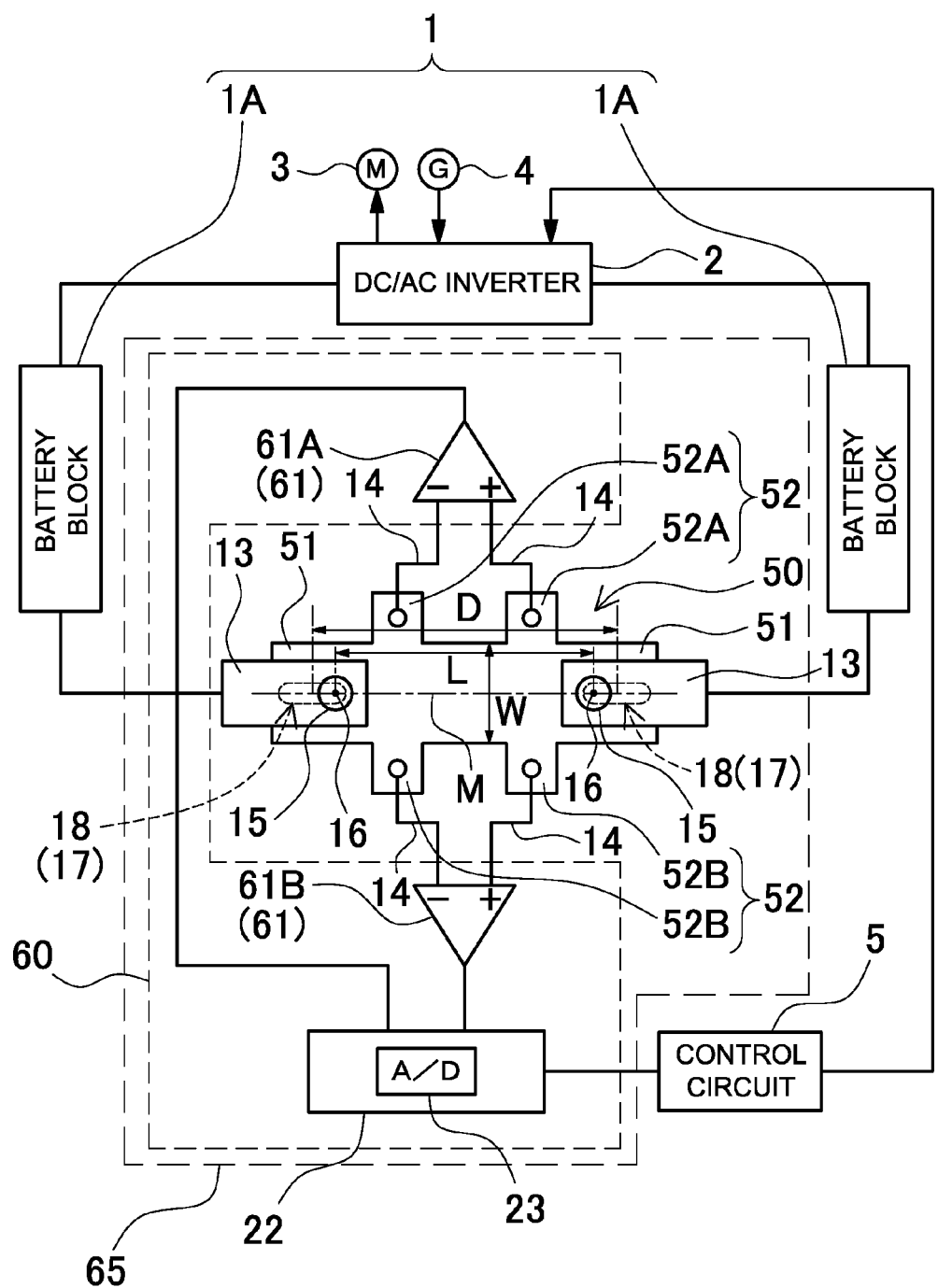
FIG. 7 is an abbreviated schematic of a power source apparatus configuration for another embodiment of the present invention.
Figure 8:
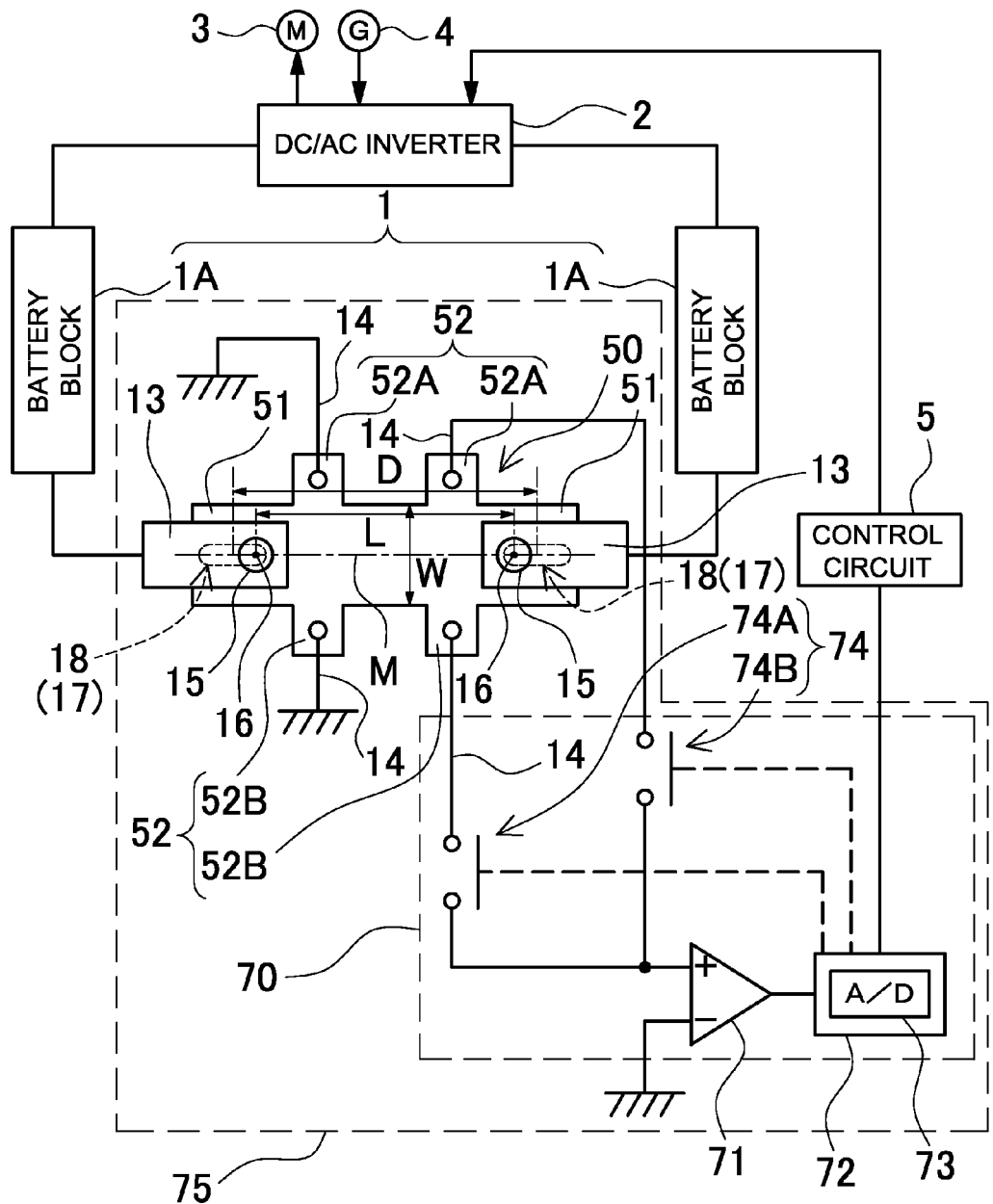
FIG. 8 is an abbreviated schematic of a power source apparatus configuration for another embodiment of the present invention.

The shunt resistor 50 in FIGS. 7 and 8 is provided with voltage detection terminals 52 that detect a plurality of voltage drops to enable battery 1 current detection when one set of circuitry fails. To detect the voltage drops produced across a plurality of voltage detection terminal 52 pairs, the current computation circuit 60 in FIG. 7 is provided with a plurality of amplifiers 61. The first amplifier 61A has its inverting and non-inverting input terminals connected to the voltage detection terminals 52A established on one side of the shunt resistor 50. The second amplifier 61B has its inverting and non-inverting input terminals connected to the voltage detection terminals 52B established on the other side of the shunt resistor 50. In this current computation circuit 60, battery 1 current is detected with signals output from the first amplifier 61A. If circuitry connected with the first amplifier 61A malfunctions, battery 1 current is detected with signals output from the second amplifier 61B. Malfunction of circuitry connected with the first amplifier 61A can be determined, for example, when the control circuit 5 controls the DC/AC inverter 2 to supply power from the batteries 1 to the motor 3 and regardless of that the current computation circuit 60 detects no current (detected current is 0A).

The current computation circuit 70 in FIG. 8 is provided with switches 74 on the input-side, and shunt resistor 50 voltage detection terminals 52A, 52B are switch-selected for input to the computation section 72 via the amplifier 71. The two pair of voltage detection terminals 52 on the two sides of the shunt resistor 50 each have one grounded voltage detection terminal 52 next to the current flow terminal 51 at one end and have the voltage detection terminal 52 next to the current flow terminal 51 at the other end connected to the computation section 72 via the switches 74 and amplifier 71. This current computation circuit 70 has one amplifier 71 connected at the input-side of the computation section 72, converts signals amplified by the amplifier 71 to digital signals via the A/D converter 73, and computes the current.

This current computation circuit 70 has a first switch 74A switched to the ON state and second switch 74B switched to the OFF state to detect battery 1 current from signals input to the computation section 72 from the first switch 74A. If circuitry connected to the first switch 74A malfunctions, the first switch 74A is turned OFF, the second switch 74B is turned ON, and battery 1 current is detected from signals input to the computation section 72 from the second switch 74B.

The invention claimed is:

1. A power source apparatus comprising:
batteries that can be charged;
a shunt resistor connected in series with the batteries that can be charged; and a current computation circuit that detects the voltage induced by current flow through the shunt resistor and computes a battery current through the batteries, wherein the shunt resistor is provided with a pair of current flow terminals at two points on a metal plate that are separated and connected in series with the batteries via connecting leads, and a pair of voltage detection terminals on a side of the metal plate between the pair of current flow terminals where a voltage is induced proportional to the current flow, and wherein the shunt resistor has interval adjustment structures to adjust the distance between attachment points where the connecting leads attach to the pair of current flow terminals, and the distance between the attachment points where the pair of connecting leads attach is adjusted with the interval adjustment structures to finely adjust the voltage induced at the voltage detection terminals due to current flow between the two attachment points.

2. The power source apparatus as cited in claim 1, wherein the batteries are batteries that supply power to a motor that drives a vehicle.

3. The power source apparatus as cited in claim 1, wherein the ratio of the lateral width of the metal plate shunt resistor to the distance between the pair of current flow terminals is greater than 1/20.

4. The power source apparatus as cited in claim 1, wherein the connecting leads attach to the current flow terminals via set-screws, the interval adjustment structures are holes elongated in a direction that can adjust the distance between lead attachment points, and the bolts insert through the elongated holes to attach the connecting leads to the current flow terminals.

5. The power source apparatus as cited in claim 1, wherein the shunt resistor has voltage detection terminals established in a manner projecting outward from the region between the pair of current flow terminals.

6. The power source apparatus as cited in claim 1, wherein the current computation circuit computes battery charging and discharging current from voltage induced in the shunt resistor, and a control circuit is provided that computes remaining battery capacity from the detected current and controls battery charging and discharging.

* * * * *